(12) United States Patent
Oishi

(10) Patent No.: US 8,872,582 B2
(45) Date of Patent: Oct. 28, 2014

(54) AMPLIFIER CIRCUIT

(71) Applicant: Fujitsu Limited, Kawasaki (JP)

(72) Inventor: Kazuaki Oishi, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/284,035

(22) Filed: May 21, 2014

(65) Prior Publication Data

US 2014/0253232 A1    Sep. 11, 2014

Related U.S. Application Data

(63) Continuation of application No. PCT/JP2011/079338, filed on Dec. 19, 2011.

(51) Int. Cl.
| | | |
|---|---|---|
| H03G 3/20 | (2006.01) | |
| H03F 3/193 | (2006.01) | |
| H03F 3/21 | (2006.01) | |
| H03F 1/02 | (2006.01) | |

(52) U.S. Cl.
CPC ........ H03F 1/0216 (2013.01); *H03F 2200/102* (2013.01); H03F 3/193 (2013.01); H03F 3/21 (2013.01); *H03F 2200/451* (2013.01)
USPC .......................................... 330/136; 330/297

(58) Field of Classification Search
USPC .................. 330/136, 297, 296, 285
See application file for complete search history.

(56) References Cited

U.S. PATENT DOCUMENTS

| | | | |
|---|---|---|---|
| 5,251,330 A | 10/1993 | Chiba et al. | |
| 6,590,940 B1 | 7/2003 | Camp, Jr. et al. | |
| 7,583,149 B2 * | 9/2009 | Funaki et al. | 330/297 |
| 7,855,599 B2 * | 12/2010 | Yamanouchi | 330/136 |
| 7,898,327 B2 * | 3/2011 | Nentwig | 330/149 |
| 8,669,811 B2 * | 3/2014 | Le Gallou et al. | 330/136 |
| 8,686,792 B2 * | 4/2014 | Sukegawa et al. | 330/136 |

FOREIGN PATENT DOCUMENTS

| | | |
|---|---|---|
| JP | 53-12228 | 2/1978 |
| JP | 3-104422 | 5/1991 |
| JP | 2003-500873 | 1/2003 |
| JP | 2003-179444 | 6/2003 |
| JP | 2008-193298 | 8/2008 |

OTHER PUBLICATIONS

Feipeng Wang et al., "Design of Wide-Bandwidth Envelope-Tracking Power Amplifiers for OFDM Applications", IEEE Transactions on Microwave Theory and Techniques, vol. 53, No. 4, pp. 1244-1255, Apr. 2005.

(Continued)

*Primary Examiner* — Henry Choe
(74) *Attorney, Agent, or Firm* — Fujitsu Patent Center

(57) ABSTRACT

An amplifier circuit includes: a first filter that receives input of amplitude information of an input signal, and performs filtering so that a gain of a frequency component higher than a first cutoff frequency becomes greater than a gain of a frequency component lower than the first cutoff frequency; a power supply circuit that has a low-pass filter characteristic that a gain of a frequency component lower than a second cutoff frequency is greater than a gain of a frequency component higher than the second cutoff frequency, and receives input of amplitude information outputted from the first filter and generates a power supply voltage corresponding to the amplitude information outputted from the first filter; and an amplifier that receives supply of the power supply voltage generated by the power supply circuit, and amplifies a signal based on the input signal.

10 Claims, 9 Drawing Sheets

(56) References Cited

OTHER PUBLICATIONS

International Search Report, mailed in connection with PCT/JP2011/079338 and mailed Jan. 24, 2012.

Notification of Transmittal of Copies of Translation of the International Preliminary Report on Patentability, PCT/JP2011/079338, 6 pages, dated Jul. 3, 2014.

* cited by examiner

F I G. 11
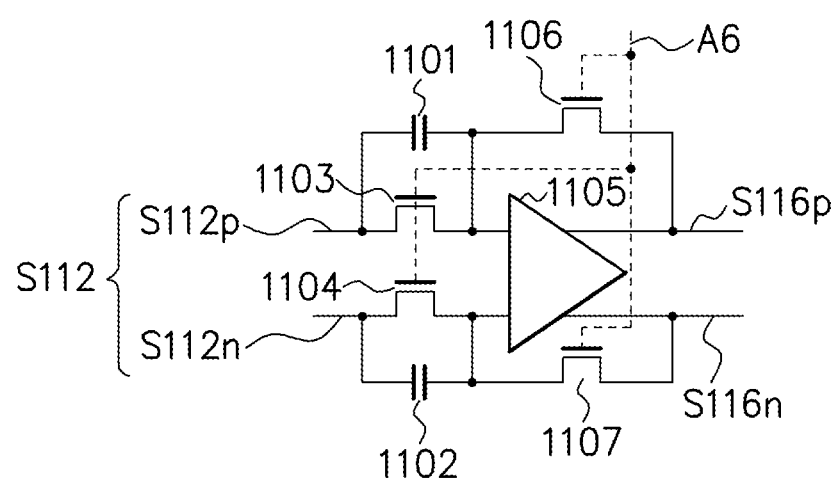

US 8,872,582 B2

AMPLIFIER CIRCUIT

CROSS-REFERENCE TO RELATED APPLICATION

This application is a continuation application of International Application PCT/JP2011/079338 filed on Dec. 19, 2011 and designated the U.S., the entire contents of which are incorporated herein by reference.

FIELD

The embodiments discussed herein are directed to an amplifier circuit.

BACKGROUND

For a transmitter of radio communication, a power amplifier is used to transmit radio waves in air. The power amplifier needs to output a signal of large power and is therefore a block consuming large power in the transmitter. Therefore, it is important to increase the power efficiency of the power amplifier to decrease the power consumption.

There are known linear mode power amplifier that receives supply of a power supply voltage based on an amplitude signal of an input signal and amplifies the input signal, and power amplifier that receives supply of a power supply voltage based on an amplitude signal of an input signal and amplifies a phase signal of the input signal (refer to, for example, the following Non-Patent Document 1).

Further, there is a known voltage control power amplifier that controls a drain voltage of a field effect transistor according to the envelope of an input signal and includes an envelope detection unit that detects the envelope of the input signal, a voltage control unit that controls the drain voltage according to the envelope of the input signal, and a feedback control unit that compares the envelope of the input signal and the drain voltage and controls the voltage control unit to make the error between them to zero (refer to, for example, the following Patent Document 1).

Patent Document 1: Japanese Laid-open Patent Publication No. 2003-179444

Non-Patent Document

Non-Patent Document 1: Feipeng Wang, Annie Hueiching Yang, Donald F. Kimball, Lawrence E. Larson, and Peter M. Asbeck, "Design of Wide-Bandwidth Envelope-Tracking Power Amplifiers for OFDM Applications", IEEE TRANSACTIONS ON MICROWAVE THEORY AND TECHNIQUES, VOL. 53, No. 4, p 1244, APRIL 2005.

SUMMARY

An amplifier circuit includes: a first filter that receives input of amplitude information of an input signal, and performs filtering so that a gain of a frequency component higher than a first cutoff frequency becomes greater than a gain of a frequency component lower than the first cutoff frequency; a power supply circuit that has a low-pass filter characteristic that a gain of a frequency component lower than a second cutoff frequency is greater than a gain of a frequency component higher than the second cutoff frequency, and receives input of amplitude information outputted from the first filter and generates a power supply voltage corresponding to the amplitude information outputted from the first filter; and an amplifier that receives supply of the power supply voltage generated by the power supply circuit, and amplifies a signal based on the input signal.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 11 is a diagram illustrating a configuration example of a first filter in FIG. 7.

DESCRIPTION OF EMBODIMENTS

First Embodiment

Figure 1:
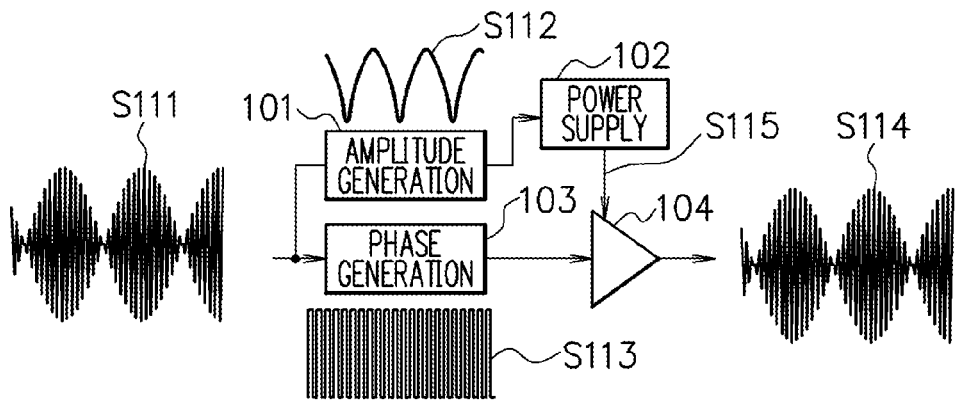
FIG. 1 is a diagram illustrating a configuration example of an amplifier circuit.

FIG. 1 is a diagram illustrating a configuration example of an amplifier circuit. The amplifier circuit has an amplitude generation unit 101, a power supply circuit 102, a phase generation unit 103, and a switch mode power amplifier 104, and receives input of an input signal S111 and outputs an output signal S114 made by amplifying the input signal S111.

The amplitude generation unit 101 receives input of the input signal S111 and generates amplitude information S112 of the input signal S111. The amplitude information S112 corresponds to an envelope waveform of a signal obtained by rectifying the input signal S111. The power supply circuit 102 receives input of the amplitude information S112 and generates a power supply voltage S115 corresponding to the amplitude information S112. The phase generation unit 103 receives input of the input signal S111 and generates phase information S113 of the input signal S111. The input signal S111 is decomposed into the amplitude information S112 and the phase information S113. The switch mode power amplifier 104 receives supply of the power supply voltage S115 generated by the power supply circuit 102, amplifies the phase information S113 by a switching operation of a transistor, and outputs the amplified output signal S114.

As described above, the switch mode power amplifier 104 is capable of amplifying only the phase information S113 to cause the transistor to perform the switching operation, and the amplitude generation unit 101 and the power supply circuit 102 are necessary to amplify the amplitude information S112. The input signal S111 is decomposed into the amplitude information S112 and the phase information S113. The power supply circuit 102 modulates the power supply voltage S115 on the basis of the amplitude information S112. The switch mode power amplifier 104 receives supply of the power supply voltage S115 and amplifies the phase information S113.

Figure 2:
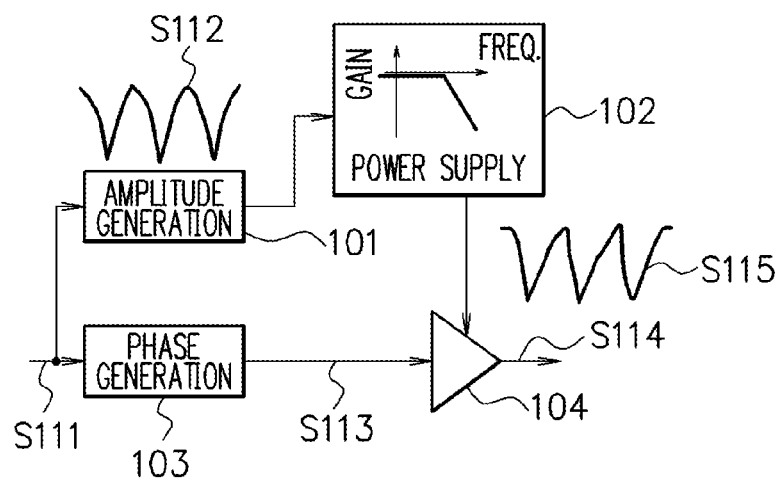
FIG. 2 is a diagram for explaining the problem of the amplifier circuit in FIG. 1.

FIG. 2 is a diagram for explaining the problem of the amplifier circuit in FIG. 1. The power supply circuit 102 has a low-pass filter characteristic that the gain of a frequency component lower than a cutoff frequency is greater than the gain of a frequency component higher than the cutoff frequency. Due to the low-pass filter characteristic, distortion is generated in the power supply voltage S115. To decrease the distortion of the power supply voltage S115, a high-speed power supply circuit 102 with a high cutoff frequency is necessary. However, the power supply circuit 102 decreases more in power supply voltage generation efficiency as its speed is higher, thus decreasing the total efficiency of the amplifier circuit. Accordingly, an amplifier circuit capable of decreasing the distortion of the power supply voltage S115 while using a low-speed power supply circuit 102 is desired to increase the efficiency.

Hereinafter, an embodiment capable of decreasing the distortion of the power supply voltage S115 caused by a low-pass filter characteristic of the power supply circuit 102.

Figure 3A:
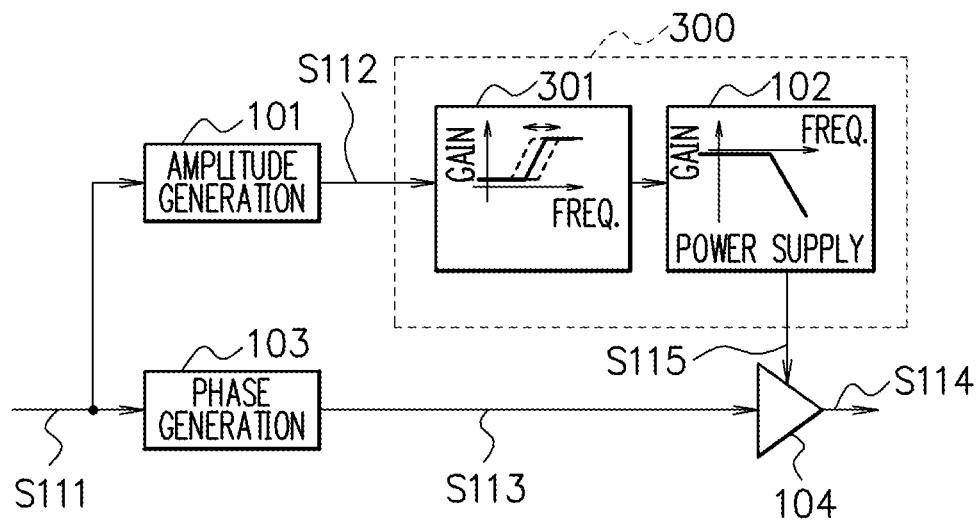
FIG. 3A is a diagram illustrating a configuration example of an amplifier circuit according to a first embodiment.
Figure 3B:
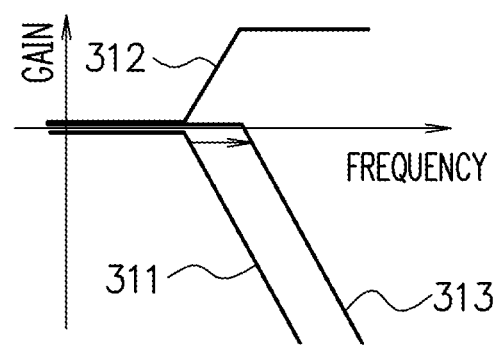
FIG. 3B is a chart illustrating an example of a frequency characteristic of the amplifier circuit in FIG. 3A.

FIG. 3A is a diagram illustrating a configuration example of an amplifier circuit according to a first embodiment, and FIG. 3B is a chart illustrating an example of a frequency characteristic of the amplifier circuit in FIG. 3A. The amplifier circuit in FIG. 3A is made by adding a first filter 301 to the amplifier circuit in FIG. 1 and FIG. 2. The amplifier circuit has an amplitude generation unit 101, a distortion compensation power supply unit 300, a phase generation unit 103, and a switch mode power amplifier 104, and receives input of an input signal S111 and outputs an output signal S114 made by amplifying the input signal S111. The distortion compensation power supply unit 300 has the first filter 301 and the power supply circuit 102.

The amplitude generation unit 101 receives input of the input signal S111 and generates amplitude information S112 of the input signal S111. The amplitude information S112 corresponds to an envelope waveform of a signal obtained by rectifying the input signal S111.

The first filter 301 is a high-pass filter or a band-pass filter and receives input of the amplitude information S112 of the input signal and performs filtering so that the gain of a frequency component higher than a first cutoff frequency becomes greater than the gain of a frequency component lower than the first cutoff frequency, as illustrated in a frequency characteristic 312 in FIG. 3B. For instance, the first filter 301 has a high-pass filter characteristic that the gain increases at the first cutoff frequency or higher. The reason why the gain is constant on the high frequency side in the frequency characteristic 312 in FIG. 3B is because of, for example, a limited band of an operational amplifier constituting the first filter 301. The first filter 301 is preferably a high-pass filter. However, an actual high-pass filter has difficulty in realizing an ideal high-pass filter and thus has a characteristic similar to that of the band-pass filter. Therefore, the first filter 301 may be a band-pass filter.

The power supply circuit 102 has a low-pass filter characteristic that the gain of a frequency component lower than a second cutoff frequency is greater than the gain of a frequency component higher than the second cutoff frequency, and receives input of the amplitude information outputted from the first filter 301 and generates a power supply voltage S115 corresponding to the amplitude information outputted from the first filter 301. For instance, the power supply circuit 102 has a low-pass filter characteristic 311 (FIG. 3B) that the gain decreases at the second cutoff frequency or higher.

The first filter 301 is a distortion compensation circuit for decreasing the distortion of the power supply voltage S115 caused by the low-pass filter characteristic of the power supply circuit 102. Hereinafter, the reason why the first filter 301 can decrease the distortion of the power supply voltage S115 will be described. The first cutoff frequency of the frequency characteristic 312 of the first filter 301 is the same or substantially the same as the second cutoff frequency of the power supply circuit 102. Further, the characteristic of the gain in dB to the frequency of the first filter 301 preferably has a slope opposite in positive/negative sign to and having substantially the same absolute value as that of the characteristic of the gain in dB to the frequency of the power supply circuit 102. By combining the frequency characteristic 312 of the first filter 301 and the frequency characteristic 311 of the power supply circuit 102, a frequency characteristic 313 (FIG. 3B) of the power supply voltage S115 becomes high in cutoff frequency as compared with the frequency characteristic 311 of the power supply circuit 102, and its frequency band of a high gain is expanded toward the high frequency side. This makes it possible to decrease the distortion of the power supply voltage S115.

Note that though the case where the gains in a low frequency region of the frequency characteristics 311 and 312 are the same each other is illustrated in FIG. 3B, but the gains may not necessarily be the same.

The phase generation unit 103 has, for example, a limiter circuit and a delay circuit, and receives input of the input signal S111 and generates phase information S113 of the input signal S111. The input signal S111 is decomposed into the amplitude information S112 and the phase information S113. The switch mode power amplifier 104 receives supply of the power supply voltage S115 generated by the power supply circuit 102, amplifies the phase information S113 by a switching operation of a transistor, and outputs the amplified output signal S114.

The switch mode power amplifier 104 is capable of amplifying only the phase information S113 to cause the transistor to perform the switching operation, and the amplitude generation unit 101 and the distortion compensation power supply unit 300 are necessary to amplify the amplitude information S112. The input signal S111 is decomposed into the amplitude information S112 and the phase information S113. The distortion compensation power supply unit 300 modulates the power supply voltage S115 on the basis of the amplitude information S112. The switch mode power amplifier 104 receives supply of the power supply voltage S115 and amplifies the phase information S113.

Figure 4A:
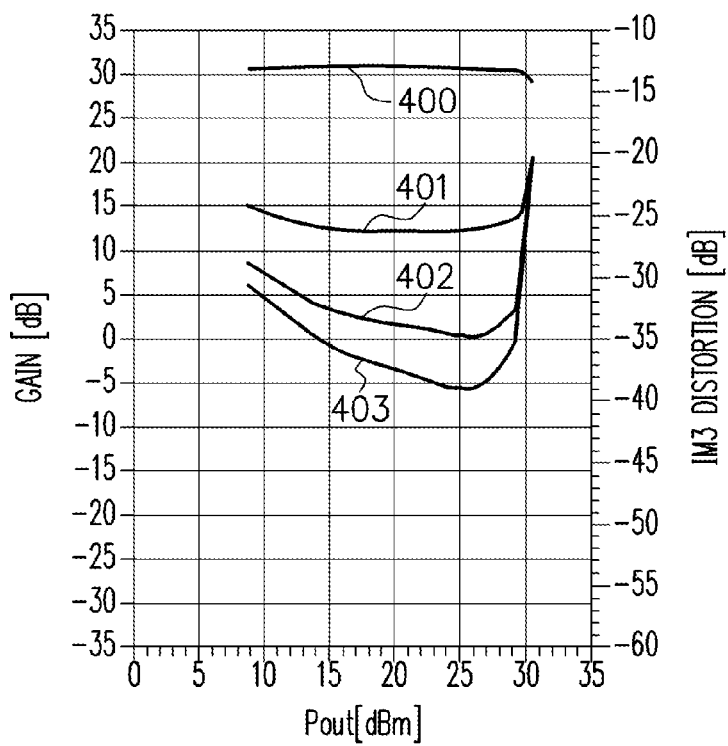
FIG. 4A is a chart illustrating a simulation result of the amplifier circuit in FIG. 1 and FIG. 2.

FIG. 4A is a chart illustrating a simulation result of the amplifier circuit in FIG. 1 and FIG. 2. The horizontal axis indicates the power of the output signal S114, the left vertical axis indicates the gain of the output signal S114, and the right vertical axis indicates the third order distortion amount of the output signal S114. A gain characteristic 400 indicates the gain (left vertical axis) to the power of the output signal S114. Third order distortion amount characteristics 401 to 403 indicate third order distortion amounts (right vertical axis) to the power of the output signal S114. The third order distortion amount characteristic 401 is the characteristic in the case where the second cutoff frequency of the power supply circuit 102 is 5 MHz. The third order distortion amount characteristic 402 is the characteristic in the case where the second cutoff frequency of the power supply circuit 102 is 10 MHz. The third order distortion amount characteristic 403 is the characteristic in the case where the second cutoff frequency of the power supply circuit 102 is 15 MHz. The third order distortion amount is larger as the second cutoff frequency (5 MHz, 10 MHz, 15 MHz) of the power supply circuit 102 is lower.

Figure 4B:
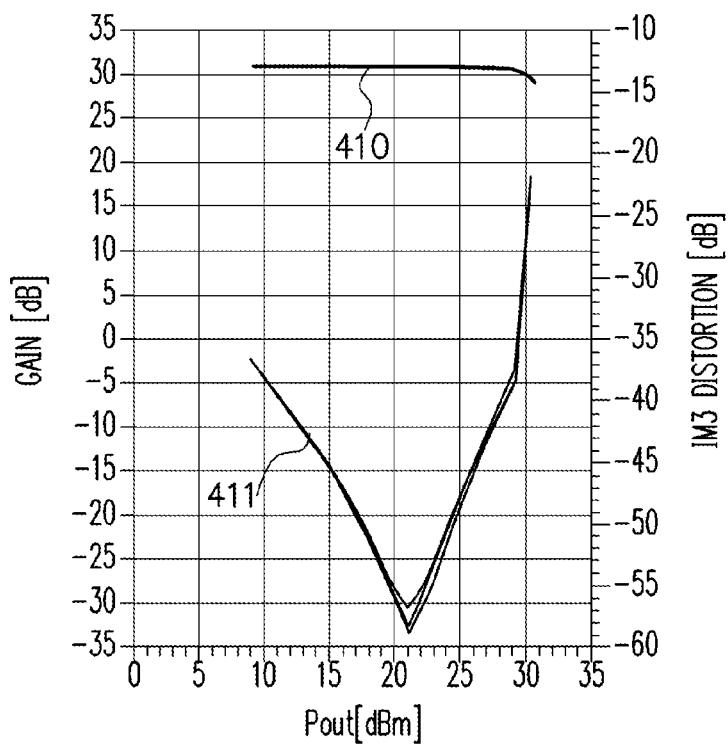
FIG. 4B is a chart illustrating a simulation result of the amplifier circuit in FIG. 3A.

FIG. 4B is a chart illustrating a simulation result of the amplifier circuit in FIG. 3A. The horizontal axis indicates the power of the output signal S114, the left vertical axis indicates the gain of the output signal S114, and the right vertical axis indicates the third order distortion amount of the output signal S114. A gain characteristic 410 indicates the gain (left vertical axis) to the power of the output signal S114. A third order distortion amount characteristic 411 indicates a third order distortion amount (right vertical axis) to the power of the output signal S114, and is the characteristics in the case where the second cutoff frequency of the power supply circuit 102 is 5 MHz, 10 MHz, and 15 MHz, which are substantially the same characteristics. In the case where the second cutoff frequency of the power supply circuit 102 was 5 MHz, the first cutoff frequency of the first filter 301 was set also to 5 MHz. In the case where the second cutoff frequency of the power supply circuit 102 was 10 MHz, the first cutoff frequency of the first filter 301 was set also to 10 MHz. In the case where the second cutoff frequency of the power supply circuit 102 was 15 MHz, the first cutoff frequency of the first filter 301 was set also to 15 MHz. By making the first cutoff frequency and the second cutoff frequency the same, the excellent distortion characteristic 411 with a small distortion amount is exhibited even when the second cutoff frequency of the power supply circuit 102 is low.

The distortion characteristic 411 (FIG. 4B) of the amplifier circuit in FIG. 3A is decreased in distortion amount as compared with the distortion amount characteristics 401 to 403 (FIG. 4A) of the amplifier circuit in FIG. 1 and FIG. 2. According to this embodiment, it is possible to decrease the distortion of the power supply voltage S115 while using the low-speed power supply circuit 102 to increase the efficiency.

Second Embodiment

Figure 5:
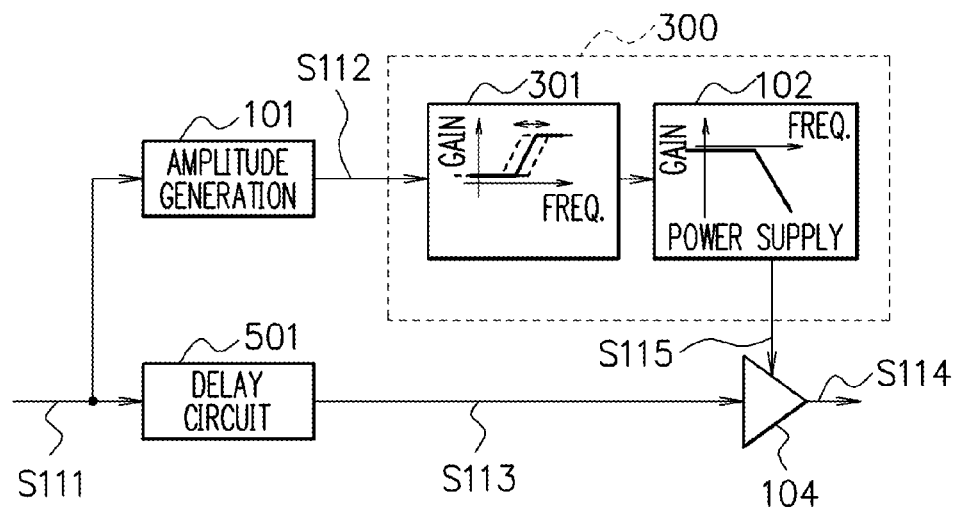
FIG. 5 is a diagram illustrating a configuration example of an amplifier circuit according to a second embodiment.

FIG. 5 is a diagram illustrating a configuration example of an amplifier circuit according to a second embodiment. In the first embodiment (FIG. 3A), the amplifier circuit using the switch mode power amplifier 104 has been described. In contrast, in the second embodiment (FIG. 5), an amplifier circuit using a linear mode power amplifier 104 will be described. Hereinafter, the points of this embodiment different from the first embodiment will be described. A delay circuit 501 is provided in place of the phase generation unit 103 in FIG. 3A. The delay circuit 501 receives input of an input signal S111, delays the input signal S111, and outputs a delayed signal S113. The linear mode power amplifier 104 receives supply of a power supply voltage S115 generated by a power supply circuit 102, linearly amplifies the input signal S113 delayed by the delay circuit 501, and outputs an amplified output signal S114. The delay circuit 501 can adjust the timings of the delay signal S113 and the power supply voltage S115.

The switch mode power amplifier 104 in the first embodiment is ideally higher in power efficiency than the linear mode power amplifier 104 in the second embodiment. This is ideally because no drain current flows in a period when a voltage is applied to the drain of a transistor in the switch mode power amplifier 104, whereas no drain voltage is applied in a period when the drain current flows, so that power consumption=drain voltage×drain current=0.

Third Embodiment

In the amplifier circuit in FIG. 3A, the first cutoff frequency of the first filter 301 and the second cutoff frequency of the power supply circuit 102 independently change due to the manufacturing variation, temperature fluctuation and so on. As a result, if deviation occurs between the first cutoff frequency of the first filter 301 and the second cutoff frequency of the power supply circuit 102, the effect of decreasing the distortion of the power supply voltage S115 is weakened.

Figure 6:
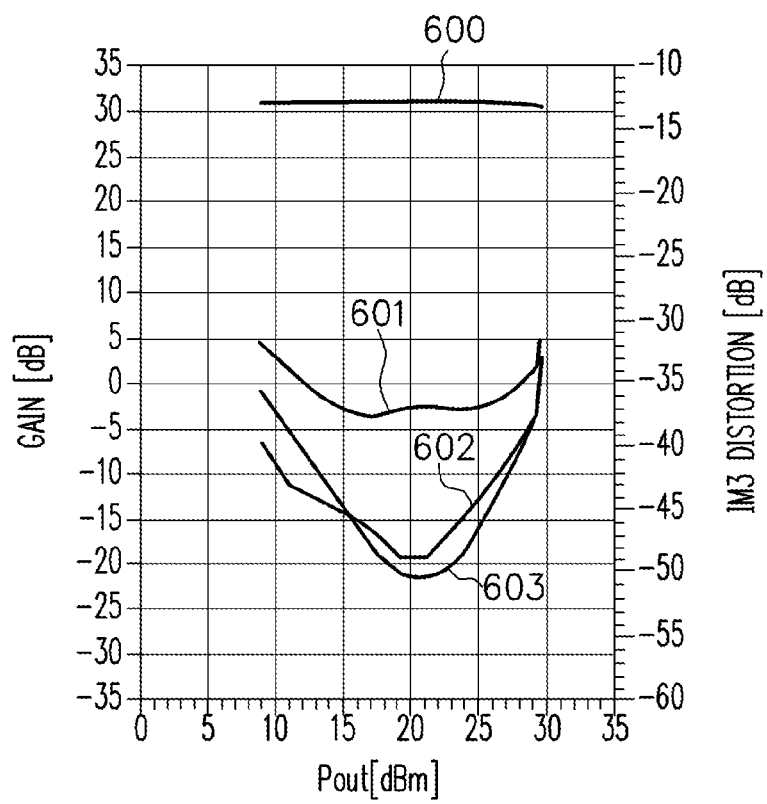
FIG. 6 is a chart illustrating a simulation result when a deviation occurs between a first cutoff frequency of a first filter and a second cutoff frequency of a power supply circuit.

FIG. 6 is a chart illustrating a simulation result when a deviation occurs between the first cutoff frequency of the first filter 301 and the second cutoff frequency of the power supply circuit 102. The horizontal axis indicates the power of the output signal S114, the left vertical axis indicates the gain of the output signal S114, and the right vertical axis indicates the third order distortion amount of the output signal S114. A gain characteristic 600 indicates the gain (left vertical axis) to the power of the output signal S114. Third order distortion amount characteristics 601 to 603 indicate third order distortion amounts (right vertical axis) to the power of the output signal S114. The third order distortion amount characteristic 601 is the characteristic in the case where the second cutoff frequency of the power supply circuit 102 is 5 MHz and the first cutoff frequency of the first filter 301 is 10 MHz. The third order distortion amount characteristic 602 is the characteristic in the case where the second cutoff frequency of the power supply circuit 102 is 15 MHz and the first cutoff frequency of the first filter 301 is 10 MHz. The third order distortion amount characteristic 603 is the characteristic in the case where the second cutoff frequency of the power supply circuit 102 is 10 MHz and the first cutoff frequency of the first filter 301 is 10 MHz. It is found that when deviation occurs between the first cutoff frequency of the first filter 301 and the second cutoff frequency of the power supply circuit 102, the distortion amount of the power supply voltage S115 increases.

Figure 7:
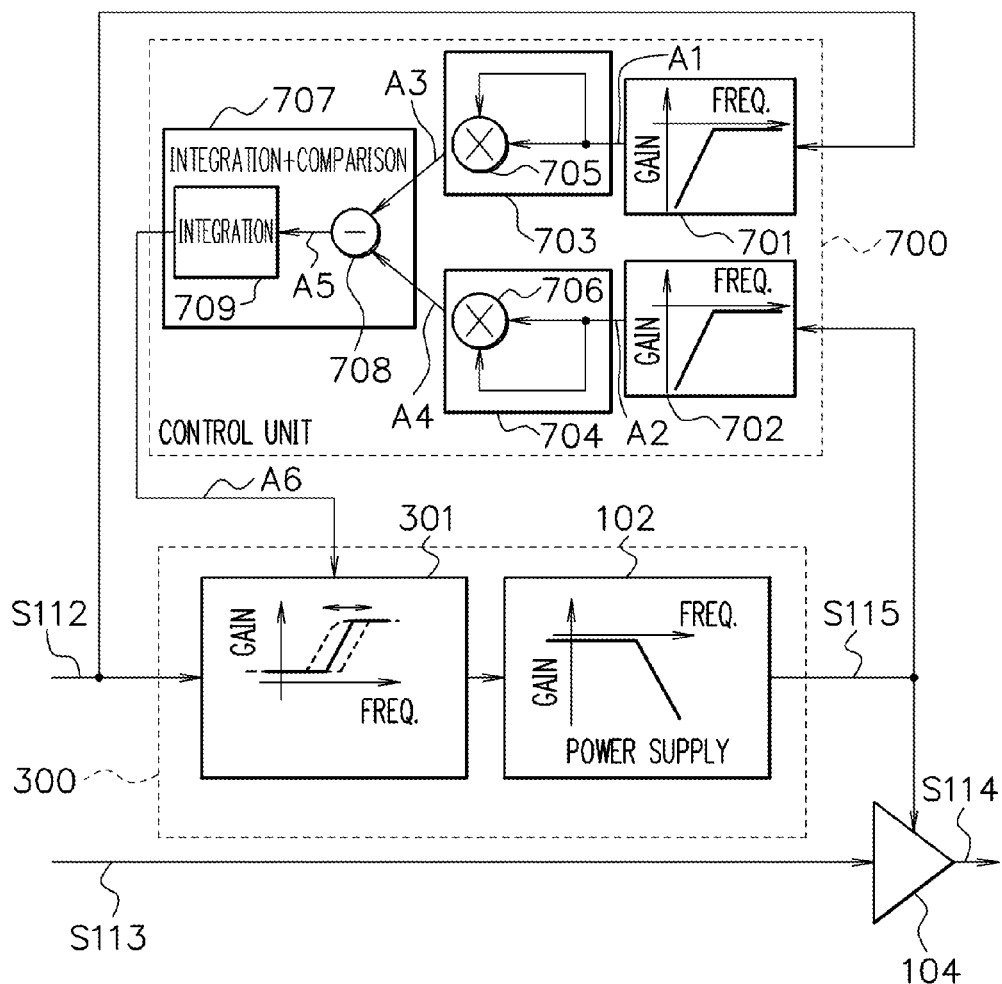
FIG. 7 is a diagram illustrating a configuration example of an amplifier circuit according to a third embodiment.

FIG. 7 is a diagram illustrating a configuration example of an amplifier circuit according to a third embodiment. The amplifier circuit in this embodiment can perform control to decrease the deviation between the first cutoff frequency of the first filter 301 and the second cutoff frequency of the power supply circuit 102. This embodiment (FIG. 7) is made by adding a control unit 700 to the first embodiment (FIG. 3A) and the second embodiment (FIG. 5). Hereinafter, the points of this embodiment different from the first embodiment and the second embodiment will be described.

The control unit 700 has a third filter 701, a fourth filter 702, strength detectors 703, 704, and a comparison and integration unit 707. The comparison and integration unit 707 has a comparator 708 and an integrator 709.

The third filter 701 is a high-pass filter or a band-pass filter and performs filtering so that the gain of a frequency component higher than a third cutoff frequency becomes greater than the gain of a frequency component lower than the third cutoff frequency. The third filter 701 performs filtering to decrease the gain of a signal in a low frequency band and increase the gain of a signal near the second cutoff frequency of the power supply circuit 102. The strength detector 703 detects a signal strength A3 of an output signal (amplitude information) A1 of the third filter 701. For instance, the strength detector 703 detects the signal strength A3 of the amplitude information A1 by squaring the amplitude information A1 by a multiplier 705.

The fourth filter 702 is a high-pass filter or a band-pass filter and performs filtering so that the gain of a frequency component higher than a fourth cutoff frequency becomes greater than the gain of a frequency component lower than the fourth cutoff frequency. The fourth filter 702 performs filtering to decrease the gain of a signal in a low frequency band and increase the gain of a signal near the second cutoff frequency of the power supply circuit 102. The fourth filter 702 receives input of a power supply voltage S115 generated by the power supply circuit 102, and outputs a power supply voltage A2. The strength detector 704 detects a signal strength A4 of the output signal (power supply voltage) A2 of the fourth filter 702. For instance, the strength detector 704 detects the signal strength A4 of the power supply voltage A2 by squaring the power supply voltage A2 by a multiplier 706.

The comparator 708 compares the signal strength A3 of the amplitude information and the signal strength A4 of the power supply voltage, and outputs a difference A5 between the signal strength A3 of the amplitude information and the signal strength A4 of the power supply voltage. The integrator 709 integrates the difference A5 outputted from the comparator 708, and outputs an integrated difference A6.

The first filter 301 changes the first cutoff frequency in a direction in which the difference A6 integrated by the integrator 709 decreases. This makes the first cutoff frequency of the first filter 301 the same or substantially the same as the second cutoff frequency of the power supply circuit 102. The control unit 700 can control the first cutoff frequency of the first filter 301 so that the first filter 301 performs optimum distortion compensation. Further, also when the second cutoff frequency of the power supply circuit 102 changes, the control unit 700 can control the first cutoff frequency of the first filter 301 so that the first filter 301 performs optimum distortion compensation.

Figure 8:
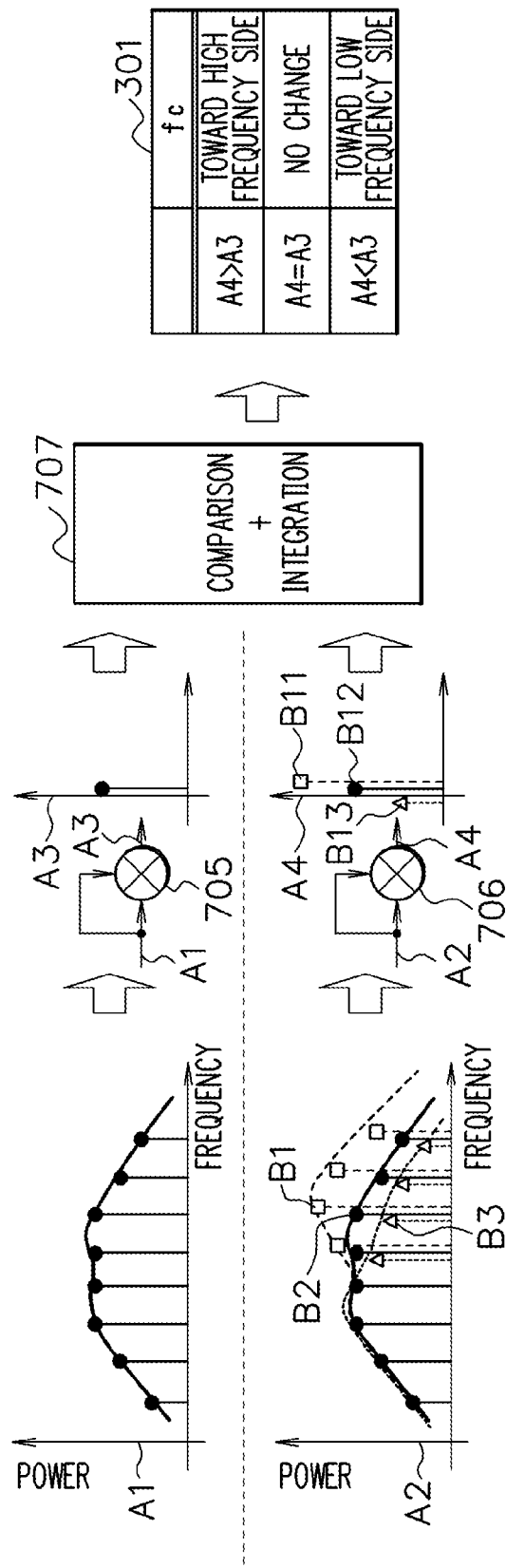
FIG. 8 is a diagram for explaining the operation of the amplifier circuit in FIG. 7.

FIG. 8 is a diagram for explaining the operation of the amplifier circuit in FIG. 7. The amplitude information A1 is extracted with a signal near the second cutoff frequency of the power supply circuit 102 emphasized by the third filter 701. Thereafter, the multiplier 705 of the strength detector 703 detects the signal strength A3 of the output signal (amplitude information) A1 of the third filter 701.

The power supply voltage A2 is extracted with a signal near the second cutoff frequency of the power supply circuit 102 emphasized by the fourth filter 702. Thereafter, the multiplier 706 of the strength detector 704 detects the signal strength A4 of the output signal (power supply voltage) A2 of the fourth filter 702.

The comparison and integration unit 707 compares and integrates the signal strength A3 and the signal strength A4, and feedback-controls a first cutoff frequency fc of the first filter 301. The feedback-control has a function of making the second cutoff frequency of the power supply circuit 102 substantially coincide with the first cutoff frequency fc of the first filter 301. Its principle will be described below.

If the first cutoff frequency of the first filter 301 is lower than the second cutoff frequency of the power supply circuit 102, the power supply voltage A2 becomes a high power supply voltage B1 and the signal strength A4 of the power supply voltage becomes a high signal strength B11. Low frequency components of the amplitude information A1 and the power supply voltage A2 substantially coincide with each other, and the signal strength B11 of the power supply voltage increases as the frequency increases. This is because the first cutoff frequency fc of the first filter 301 is low and the signal near the first cutoff frequency is therefore amplified in the first filter 301, but the gain near the first cutoff frequency is large and is not attenuated in the power supply circuit 102. As a result, the comparison and integration unit 707 determines that the signal strength A4 of the power supply voltage is higher than the signal strength A3 of the amplitude information, and feedback-controls the first filter 301 so that the first cutoff frequency fc of the first filter 301 changes toward a high frequency side.

Further, if the first cutoff frequency fc of the first filter 301 is higher than the second cutoff frequency of the power supply circuit 102, the power supply voltage A2 becomes a low power supply voltage B3 and the signal strength A4 of the power supply voltage becomes a low signal strength B13. Low frequency components of the amplitude information A1 and the power supply voltage A2 substantially coincide with each other, and the signal strength B13 of the power supply voltage decreases as the frequency increases. This is because the first cutoff frequency fc of the first filter 301 is high and the signal near the second cutoff frequency is therefore attenuated in the power supply circuit 102, but the gain near the second cutoff frequency is small and is not amplified in the first filter 301. As a result, the comparison and integration unit 707 determines that the signal strength A4 of the power supply voltage is lower than the signal strength A3 of the amplitude information, and feedback-controls the first filter 301 so that the first cutoff frequency fc of the first filter 301 changes toward a low frequency side.

Further, if the second cutoff frequency of the power supply circuit 102 and the first cutoff frequency fc of the first filter 301 are the same, the power supply voltage A2 becomes a power supply voltage B2 and the signal strength A4 of the power supply voltage becomes a signal strength B12. In this case, the comparison and integration unit 707 determines that the signal strength A4 of the power supply voltage is the same as the signal strength A3 of the amplitude information, and feedback-controls the first filter 301 not to change but to keep the first cutoff frequency fc of the first filter 301.

As described above, the control unit 700 feedback-controls the first filter 301 so that the second cutoff frequency of the power supply circuit 102 and the first cutoff frequency fc of the first filter 301 substantially coincide with each other. As a result, the power supply circuit 102 attenuates the signal near the second cutoff frequency whereas the first filter 301 amplifies the signal near the first cutoff frequency to compensate the above attenuation, thereby providing a characteristic that the frequency characteristic of the power supply voltage S115 is expanded by combining the characteristic of the first filter 301 and the low-pass filter characteristic of the power supply circuit 102.

According to this embodiment, provision of the control unit 700 makes it possible to automatically optimize the distortion compensation by the first filter 301.

Note that the third filter 701 and the fourth filter 702 are for extracting a signal near the second cutoff frequency of the power supply circuit 102 in order to compare the strengths of the signals near the second cutoff frequency of the power supply circuit 102. In particular, since the signal level of a low frequency component is high in many cases, the low frequency component is likely to be an obstacle to the comparison of the strengths of the signals near the second cutoff frequency of the power supply circuit 102. Therefore, it is preferable that the third filter 701 and the fourth filter 702 attenuate the signal of the low frequency component. However, when the signal of the low frequency component is not an obstacle to the comparison of the signal strengths, the third filter 701 and the fourth filter 702 may be omitted.

Further, the third filter 701 and the fourth filter 702 may amplify or attenuate DC gains in order to secure the accuracy or the stability of feedback.

Similarly, when the comparison of the signal strengths is possible even without the integrator 709, the integrator 709 may be omitted. The first filter 301 only needs to change the first cutoff frequency in a direction in which the difference outputted from the comparator 708 decreases.

Figure 9:
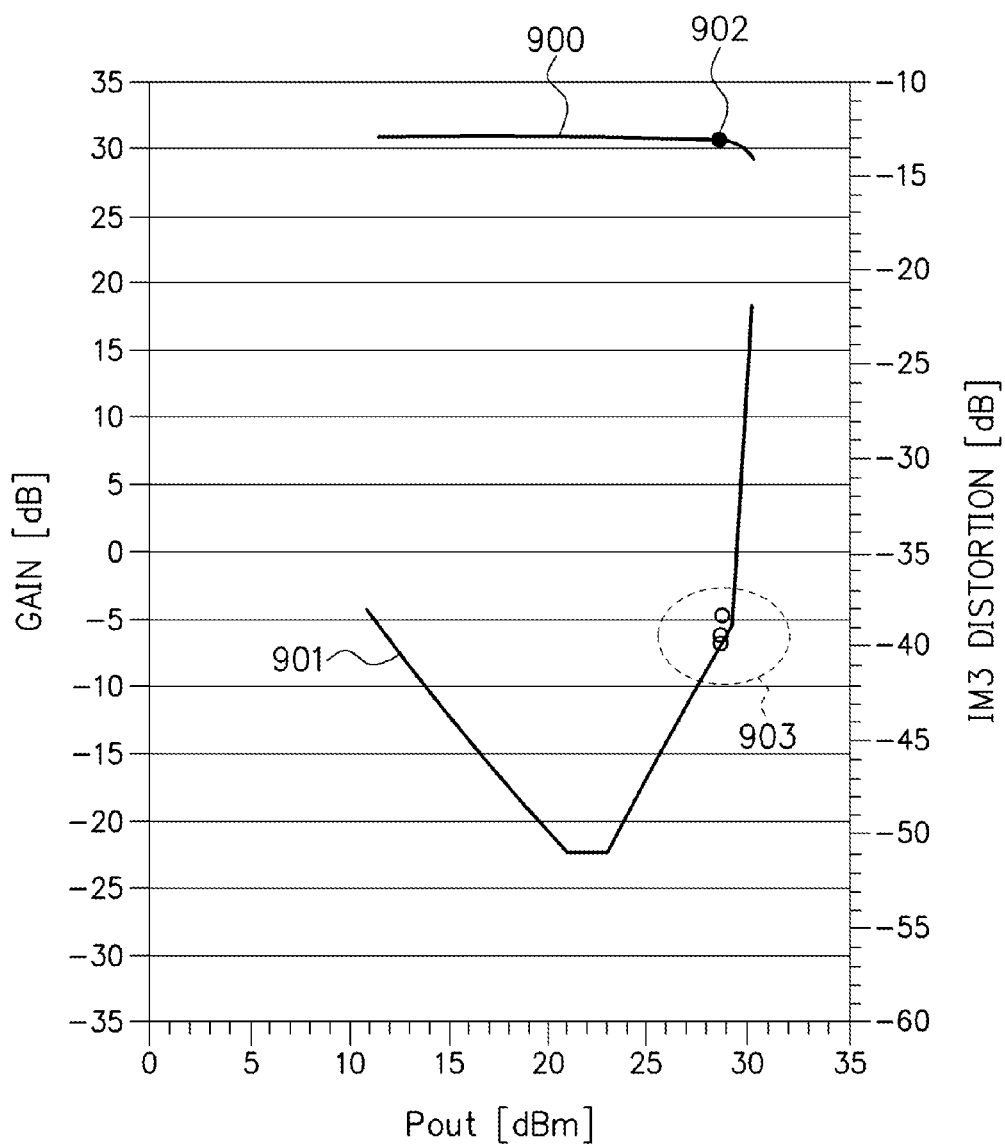
FIG. 9 is a chart illustrating a simulation result of the amplifier circuit in FIG. 7.

FIG. 9 is a chart illustrating a simulation result of the amplifier circuit in FIG. 7. The horizontal axis indicates the power of the output signal S114, the left vertical axis indicates the gain of the output signal S114, and the right vertical axis indicates the third order distortion amount of the output signal S114. Gain characteristics 900 and 902 indicate the gains (left vertical axis) to the power of the output signal S114. Gain characteristics 901 and 903 indicate third order distortion amounts (right vertical axis) to the power of the output signal S114.

The gain characteristic 900 and the third order distortion amount characteristic 901 are the characteristics in the case where when the second cutoff frequency of the power supply circuit 102 is 15 MHz, the control unit 700 performs control so that the first cutoff frequency of the first filter 301 coincides with 15 MHz.

The gain characteristic 902 and the third order distortion amount characteristic 903 are the characteristics in the case where when the second cutoff frequency of the power supply circuit 102 is 5 MHz, 7.5 MHz, 10 MHz when the power (horizontal axis) of the output signal S114 is 28.645 [dBm], the control unit 700 performs control so that the first cutoff frequency of the first filter 301 coincides with the second cutoff frequency of the power supply circuit 102.

It is found that when the second cutoff frequency of the power supply circuit 102 has changed due to the manufacturing variation and/or temperature fluctuation and so on, the control unit 700 can control so that the first cutoff frequency of the first filter 301 becomes substantially the same as the second cutoff frequency of the power supply circuit 102 according to this embodiment (FIG. 9), thereby decreasing the distortion of the power supply voltage S115 and the output signal S114 as compared with FIG. 6.

Figure 10:
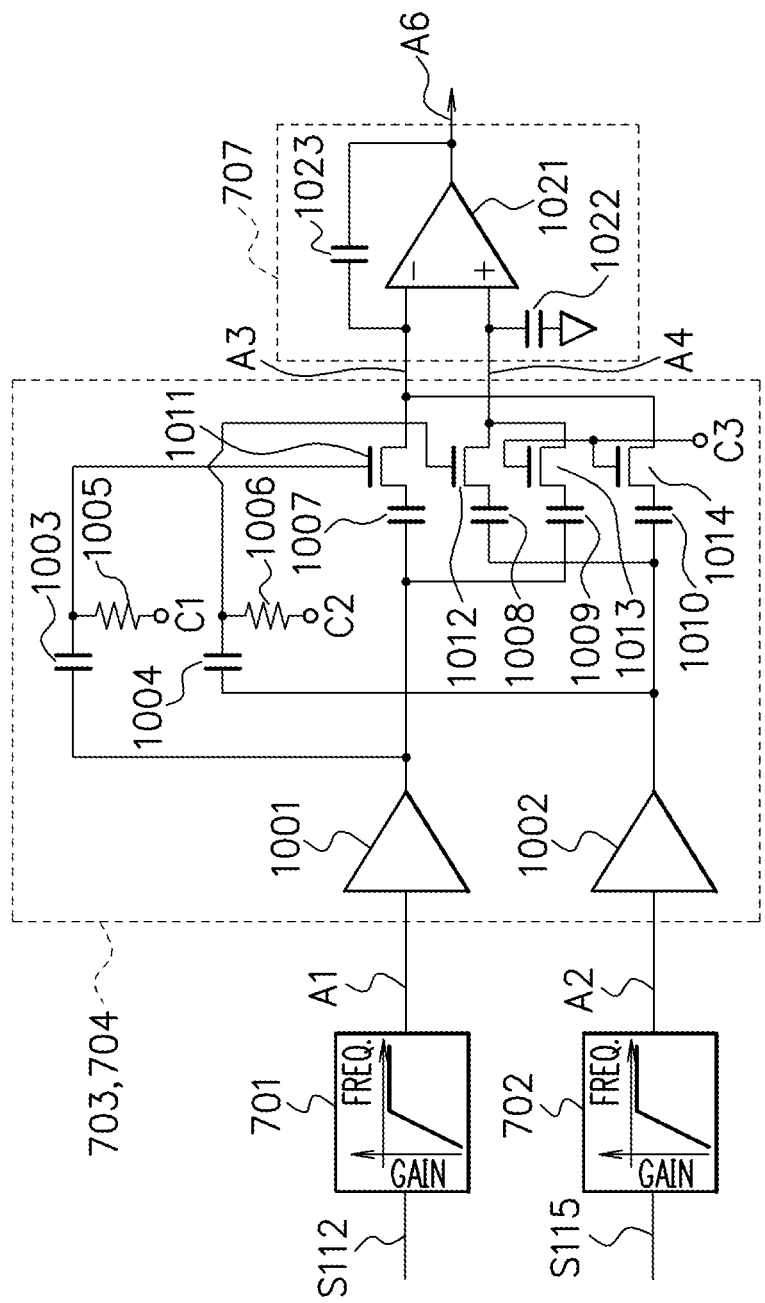
FIG. 10 is a circuit diagram illustrating a configuration example of strength detectors and a comparison and integration unit in FIG. 7.

FIG. 10 is a circuit diagram illustrating a configuration example of the strength detectors 703, 704 and the comparison and integration unit 707 in FIG. 7. The strength detectors 703 and 704 are constituted of a passive mixer circuit (square circuit) made by cross-connecting field effect transistors 1011 to 1014. The output signals A3 and A4 of the strength detectors 703 and 704 are connected to the comparison and integration unit 707 composed of an operational amplifier (comparator) 1021 and capacitors 1022, 1023.

The strength detectors 703 and 704 have buffers 1001, 1002, capacitors 1003, 1004, 1007 to 1010, n-channel field effect transistors 1011 to 1014, and resistors 1005, 1006, and receive input of bias voltages C1 to C3. The buffer 1001 buffers and outputs the output signal (amplitude information) A1 of the third filter 701. The buffer 1002 buffers and outputs the output signal (power supply voltage) A2 of the fourth filter 702. When the output signal of the buffer 1001 becomes larger than the bias voltage C1, the transistor 1011 operates in a direction to turn on and the transistor 1013 operates in a direction to turn off. When the output signal of the buffer 1001 becomes smaller than the bias voltage C1, the transistor 1011 and the transistor 1013 operate in directions opposite thereto. On the other hand, when the output signal of the buffer 1002 becomes larger than the bias voltage C2, the transistor 1012 operates in a direction to turn on and the transistor 1014 operates in a direction to turn off. When the output signal of the buffer 1002 becomes smaller than the bias voltage C2, the transistor 1012 and the transistor 1014 operate in directions opposite thereto. Thus, the signal strength A3 is outputted as a signal strength made by squaring the amplitude information A1, and the signal strength A4 is outputted as a signal strength made by squaring the power supply voltage A2.

The comparison and integration unit 707 has the operational amplifier (comparator) 1021 and the capacitors 1022, 1023. The capacitor 1022 is connected between a plus input terminal of the operational amplifier 1021 and a reference potential node. The capacitor 1023 is connected between a minus input terminal and an output terminal of the operational amplifier 1021. The integrated difference signal A6 is outputted as a signal made by integrating the difference between the signal strength A4 of the power supply voltage and the signal strength A3 of the amplitude information.

Note that in the configuration example of the comparison and integration unit 707 in FIG. 10, a circuit for deciding a direct-current voltage is separately necessary because the direct-current potential of A3, A4 is not decided, but is omitted because there is no direct relation with the operation in this embodiment.

FIG. 11 is a diagram illustrating a configuration example of the first filter 301 in FIG. 7. The first filter 301 has capacitors 1101, 1102, n-channel field effect transistors 1103, 1104, 1106, 1107, and a differential amplifier 1105, and receives input of differential signals S112p and S112n from the amplitude generation unit 101 and outputs differential signals S116p and S116n to the power supply circuit 102. The differential signals S112p and S112n correspond to the amplitude information S112 in FIG. 7.

The first filter 301 is a MOS-C active filter (primary high-pass filter) made by replacing the resistors of an RC active filter with the MOS transistors 1103, 1104, 1106, 1107. The first filter 301 is configured such that the on-resistances of the MOS transistors 1103, 1104, 1106, 1107 are made variable by controlling the gate voltages of the MOS transistors 1103, 1104, 1106, 1107 by a control signal A6. As a result, the first cutoff frequency decided by the on-resistances of the MOS transistors 1103, 1104, 1106, 1107 and the capacitors 1102, 1102 can be made variable. The first cutoff frequency can be made lower as the on-resistances of the MOS transistors 1103, 1104, 1106, 1107 are made larger. Though the primary high-pass filter has been described as an example in FIG. 11, the order of the high-pass filter characteristic of the first filter 301 and its frequency characteristic are not limited to that but are preferably selected according to the frequency characteristic of the power supply circuit 102 so as to obtain a suitable distortion compensation characteristic of the amplifier circuit.

As described above, according to the first and second embodiments, provision of the first filter (distortion compensation circuit) 301 makes it possible to decrease the distortion due to the low-pass filter characteristic of the power supply circuit 102 even if using a power supply circuit 102 which is excellent in power supply efficiency and low in speed.

Note that the above-described embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

Provision of a first filter makes it possible to decrease a distortion due to a low-pass filter characteristic of a power supply circuit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An amplifier circuit comprising:
   a first filter that receives input of amplitude information of an input signal, and performs filtering so that a gain of a frequency component higher than a first cutoff frequency becomes greater than a gain of a frequency component lower than the first cutoff frequency;
   a power supply circuit that has a low-pass filter characteristic that a gain of a frequency component lower than a second cutoff frequency is greater than a gain of a frequency component higher than the second cutoff frequency, and receives input of amplitude information outputted from the first filter and generates a power supply voltage corresponding to the amplitude information outputted from the first filter; and
   an amplifier that receives supply of the power supply voltage generated by the power supply circuit, and amplifies a signal based on the input signal.

2. The amplifier circuit according to claim 1,
   wherein the first filter is a high-pass filter or a band-pass filter.

3. The amplifier circuit according to claim 1,
   wherein the first cutoff frequency is substantially the same as the second cutoff frequency.

4. The amplifier circuit according to claim 1, further comprising:
   a strength detector that detects a signal strength of the amplitude information of the input signal and a signal strength of the power supply voltage generated by the power supply circuit; and
   a comparator that outputs a difference between the signal strength of the amplitude information of the input signal and the signal strength of the power supply voltage,
   wherein the first filter changes the first cutoff frequency in a direction in which the difference outputted from the comparator decreases.

5. The amplifier circuit according to claim 4, further comprising:
   an integrator that integrates the difference outputted from the comparator,
   wherein the first filter changes the first cutoff frequency in a direction in which the difference integrated by the integrator decreases.

6. The amplifier circuit according to claim 4, further comprising:
   a third filter that receives input of the amplitude information of the input signal, and performs filtering so that a gain of a frequency component higher than a third cutoff frequency becomes greater than a gain of a frequency component lower than the third cutoff frequency; and
   a fourth filter that receives input of the power supply voltage generated by the power supply circuit, and performs filtering so that a gain of a frequency component higher than a fourth cutoff frequency becomes greater than a gain of a frequency component lower than the fourth cutoff frequency,
   wherein the strength detector detects a signal strength of an output signal of the third filter and a signal strength of an output signal of the fourth filter.

7. The amplifier circuit according to claim 6,
   wherein the third filter and the fourth filter are high-pass filters or band-pass filters.

8. The amplifier circuit according to claim 1,
   wherein a characteristic of the gain in dB to the frequency of the first filter has a slope opposite in positive/negative sign to and having substantially the same absolute value as a slope of a characteristic of the gain in dB to the frequency of the power supply circuit.

9. The amplifier circuit according to claim 1, further comprising:
   an amplitude generation unit that receives input of the input signal and generates the amplitude information of the input signal; and
   a phase generation unit that receives input of the input signal and generates phase information of the input signal,
   wherein the first filter receives input of the amplitude information of the input signal generated by the amplitude generation unit, and
   wherein the amplifier amplifies the phase information of the input signal generated by the phase generation unit.

10. The amplifier circuit according to claim 1, further comprising:
    an amplitude generation unit that receives input of the input signal and generates the amplitude information of the input signal; and
    a delay circuit that receives input of the input signal and delays the input signal,
    wherein the first filter receives input of the amplitude information of the input signal generated by the amplitude generation unit, and
    wherein the amplifier amplifies the input signal delayed by the delay circuit.

* * * * *